United States Patent [19]

Parrish

[11] Patent Number: 4,956,602
[45] Date of Patent: Sep. 11, 1990

[54] WAFER SCALE TESTING OF REDUNDANT INTEGRATED CIRCUIT DIES

[75] Inventor: William J. Parrish, Santa Barbara, Calif.

[73] Assignee: Amber Engineering, Inc., Goleta, Calif.

[21] Appl. No.: 310,841

[22] Filed: Feb. 14, 1989

[51] Int. Cl.⁵ .................. G01R 31/28; G06F 11/26
[52] U.S. Cl. ..................... 324/158 R; 371/22.6; 371/25.1
[58] Field of Search ........... 324/73 R, 158 R, 73 PC; 371/11, 15, 20, 25, 22.1, 22.5, 22.6, 25.1

[56] References Cited

U.S. PATENT DOCUMENTS

| | | | |
|---|---|---|---|
| 4,038,648 | 7/1977 | Chesley | 371/11 |
| 4,458,297 | 7/1984 | Stopper et al. | |
| 4,467,400 | 8/1984 | Stopper | |
| 4,568,961 | 2/1986 | Noto | |
| 4,575,744 | 3/1986 | Caldwell et al. | |

FOREIGN PATENT DOCUMENTS 0212208 7/1986 European Pat. Off. ........ 324/158 R

Primary Examiner—Ernest F. Karlsen
Attorney, Agent, or Firm—Spensley Horn Jubas & Lubitz

[57] ABSTRACT

A wafer scale test system for testing redundant integrated circuit dies formed on a semiconductor wafer includes wafer scale test pads formed on the wafer and interchip multiplexor means for directing test signals applied to the wafer scale test pads to the individual integrated circuit dies. The interchip multiplexor means includes an input/output buffer circuit for receiving test signals from the wafer pads and applying the test signals to selected interchip multiplexor lines routed to the individual circuit dies. Readouts from output pads on said integrated circuit dies are routed back through the input/output buffer circuit to the wafer test pads to provide test output signals. Low cross-section connecting means are provided across dicing lanes between the integrated circuit die contact pads and the interchip multiplexor lines to avoid shorting during the dicing operation. Additionally, line protection circuits are provided to prevent destruction of the integrated circuit dies should shorting occur during dicing. The integrated circuit dies and wafer scale test system may optionally be partitioned into several separate groups to prevent faults in the interchip multiplexor system from rendering the entire wafer useless.

8 Claims, 4 Drawing Sheets

WAFER SCALE TESTING OF REDUNDANT INTEGRATED CIRCUIT DIES

BACKGROUND OF THE INVENTION

1. Field of the Invention

The present invention relates to testing of semiconductor integrated circuits. More particularly, the present invention relates to testing of redundant integrated circuit dies formed on semiconductor wafers.

2. Description of The Prior Art and Related Information

An important step in integrated circuit manufacture is testing of the individual integrated circuit dies after fabrication. Typically a large number of separate integrated circuit dies are fabricated on a single semiconductor wafer as illustrated in FIG. 1. The integrated circuit dies are separated by dicing lanes on the wafer, as illustrated in FIG. 1, and after fabrication of the integrated circuits the wafer is sawed along the dicing lanes to form the individual integrated circuit dies. After the dies are separated, individual testing of the dies may take place. Alternatively, the individual dies on the wafer may be serially tested before sawing the wafer along the dicing lanes.

The conventional prior art approach to testing redundant integrated circuit dies involves mechanical probe testing of the individual dies. In this approach each individual die is tested by placing a set of mechanical probes in physical contact with the bonding pads on the die, one die at a time in serial fashion. Upon making electrical contact with the bonding pads on the die, the die is stimulated by applying voltages to appropriate input pads and resultant output electrical signals are measured on the output pads. In some applications, integrated circuit dies which pass the initial mechanical probe testing need to be further tested in specific operating conditions. For example, in testing integrated circuit chips used as readout chips in infrared focal plane arrays, the integrated circuit dies which pass the mechanical probe testing often need to be cryogenically tested at extremely low temperatures. Such cryogenic testing is not readily accomplished with simple mechanical probe testing and each die must be individually wire bonded into a temporary package compatible with the cryogenic test procedure.

The prior art mechanical probe testing testing procedure described above has a number of disadvantages. First of all, the mechanical probe testing requires potentially damaging, temporary electrical connections to be made with the wire bond pads of each integrated circuit die. These same wire bond pads often need to be used for wire bonding the dies which pass the probe testing and the probe damage often precludes the die from passing quality inspection. This results in loss of yield. Additionally, the mechanical alignment and moving of the probes from one integrated die to the next is quite time consuming. The alignment of the probe on the individual dies so as to be positioned accurately on the easily damaged wire bond pads is inherently a very time consuming process. Indeed, due to the time consuming nature of testing integrated circuit dies, the costs of testing after processing are typically a greater factor in integrated circuit die production than the materials costs. A further disadvantage of the mechanical probe test procedure is the high electrical noise created at the probe/die interface. For integrated circuit applications requiring very low noise characteristics, such as the infrared focal plane array readout applications described above, such a temporary electrical connection is frequently incompatible with the low noise requirements of the device. Also, the mechanical probing is incompatible with testing in nonambient environments such as cryogenic environments.

The alternative to mechanical probing, wire bonding, also suffers from a number of disadvantages. First of all the process is even more time consuming than the mechanical probe test procedure described above. Also, the approach requires redundant wire bonding pads on the integrated circuit die since after testing the test wire bonds need to be removed to allow final assembly of the die. After removing the wire bonds, the wire bond pads are too damaged, however, to allow for a second wire bonding and therefore redundant wire bonds are necessary. For these reasons, the wire bonding test procedure is very expensive.

Accordingly, a need presently exists for a relatively fast and inexpensive system and method for testing redundant integrated circuit dies. In particular, a need for low noise testing of redundant integrated circuit dies presently exists for applications involving cryogenic low noise integrated circuit devices such as infrared focal plane array readout integrated circuits.

SUMMARY OF THE INVENTION

The present invention provides an improved system and method for testing redundant integrated circuit dies formed on a semiconductor wafer. The test system and method of the present invention provides relatively fast and low cost testing of integrated circuit dies. Furthermore, the test system and method of the present invention is suitable for low noise testing in extreme environments such as testing under cryogenic conditions.

In a preferred embodiment, the present invention provides a wafer scale testing system and method which is employed in conjunction with redundant integrated circuit dies fabricated on a semiconductor wafer. The individual integrated circuit dies include conventional electrical bonding pads and are each separated by dicing lanes for subsequent sawing and separation of the individual integrated circuit dies. The wafer scale testing system preferably includes a single set of wafer test pads provided on the semiconductor wafer. The wafer test pads are connected to the individual integrated circuit dies through an interchip multiplexor system. The interchip multiplexor system enables individual integrated circuit dies on the wafer to be addressed from the wafer test pads and provided with electrical test signals and allows electrical test output signals therefrom to be read out.

In a preferred embodiment, the interchip multiplexor system includes an input/output multiplexor circuit for converting signals applied to the wafer test pads to test signals applied to the individual integrated circuit dies. The interchip multiplexor system further includes interchip multiplexor lines for routing the signals to and from the individual integrated circuit dies. In a preferred embodiment, the interchip multiplexor lines include a chip select bus and a test connect bus for selecting the individual dies for testing and supplying test signals to the selected die, respectively. The interchip multiplexor lines are of necessity connected to the dies by leads which run over the dicing lanes on the semiconductor wafer. Thus, subsequent sawing of the wafer along the dicing lanes can result in shorting of the multiplexor lines to the wafer substrate. To avoid this problem, line protection circuitry is provided at the individual integrated circuit die wire bond pads to prevent shorting out of the integrated circuit die if shorting of a lead occurs during sawing. Additionally, in a preferred embodiment the interchip multiplexor lines are coupled to the integrated circuit die wire bonding pads through relatively small cross-section connection leads across the dicing lanes on the wafer to further minimize effects due to the sawing operation. Thus, by bonding or otherwise connecting a test mechanism to the single set of wafer pads the entire wafer may be tested without separate bonding or mechanical probing of each individual integrated circuit die. Dicing of the wafer may then proceed and integrated dies which have not passed the test procedure eliminated.

In a further aspect of the present invention, the wafer scale test pads and interchip multiplexor system may be partitioned into separate groups, each group having separate wafer test pads, integrated circuit dies and interchip multiplexor system. This allows flaws to occur in part of the interchip multiplexor system without destroying the entire wafer yield.

Accordingly, the present invention provides a system and method for testing redundant integrated circuit dies formed on a semiconductor wafer which provides relatively rapid serial testing of each integrated circuit die while avoiding separate mechanical bonding or probing of the individual dies. Furthermore, the system and method of the present invention allows the entire wafer to be tested in nonambient environments, such as cryogenic temperatures, without individually wire bonding the separate integrated circuit dies and without resultant damage to the integrated circuit die bonding pads. Further advantages of the wafer scale test system and method of the present invention will be apparent to those skilled in the art from the following description of the preferred embodiment.

DETAILED DESCRIPTION OF THE PREFERRED EMBODIMENT

Figure 1:
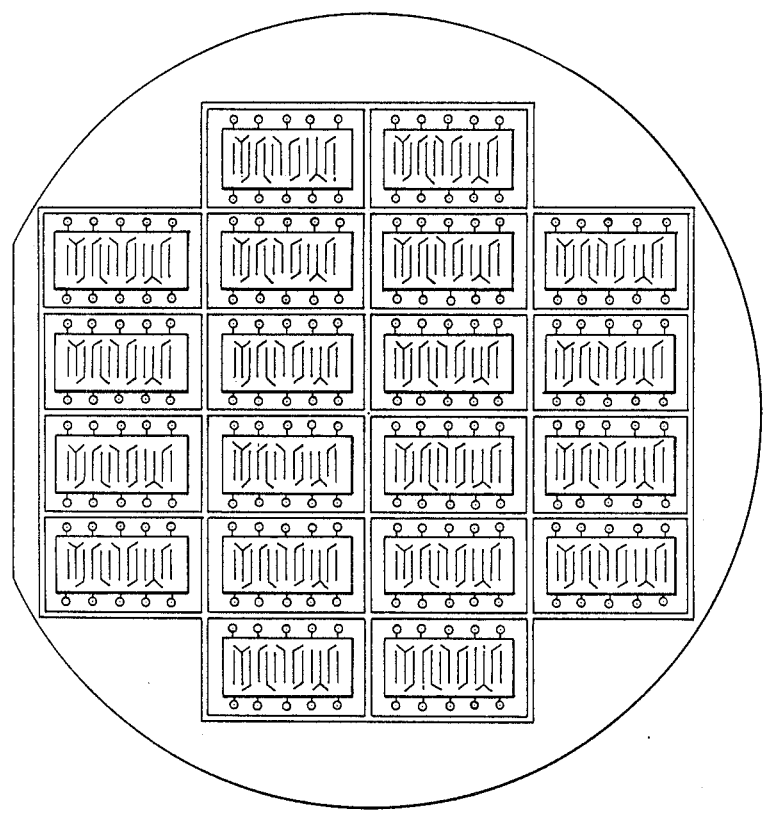
FIG. 1 is a top view of a prior art redundant integrated circuit die wafer.
Figure 2:
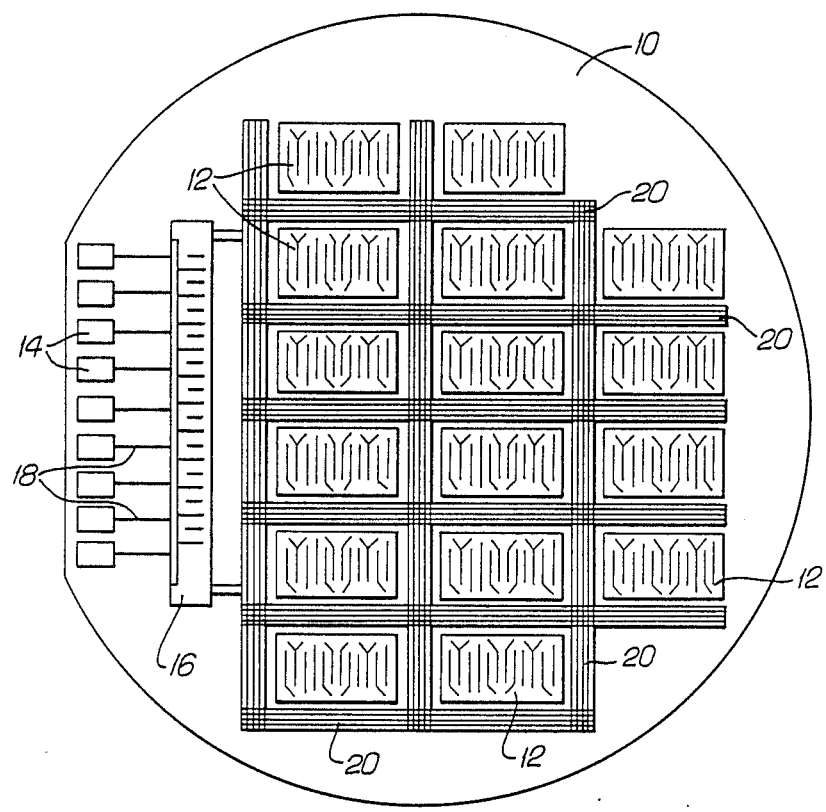
FIG. 2 is a top view of a redundant integrated circuit die wafer employing the wafer scale testing system of the present invention.

Referring to FIG. 2, a preferred embodiment of the wafer scale testing system of the present invention is illustrated implemented in a redundant integrated circuit die semiconductor wafer. As shown in FIG. 2, the semiconductor wafer substrate 10 has a large number of individual integrated circuit dies 12 formed thereon. The integrated circuit dies 12 may be of a wide variety of types and may be formed by a wide variety of different integrated circuit fabrication processes. For example, integrated circuit dies 12 may be CMOS (Complimentary Metal Oxide Semiconductor) analog readout devices such as are employed in infrared focal plane arrays (IRFPA) readout chips. Such IRFPA readout chips require careful low noise testing, such testing frequently including low noise cryogenic testing. Therefore, the wafer scale testing system of the present invention is well suited for testing such IRFPA readout chips. It will of course be appreciated that various other types of integrated circuit dies 12 may also be advantageously tested with the wafer scale testing system of the present invention. For example, gallium arsenide analog devices and other low noise analog devices will also be benefitted by the low noise testing system of the present invention.

Figure 3:
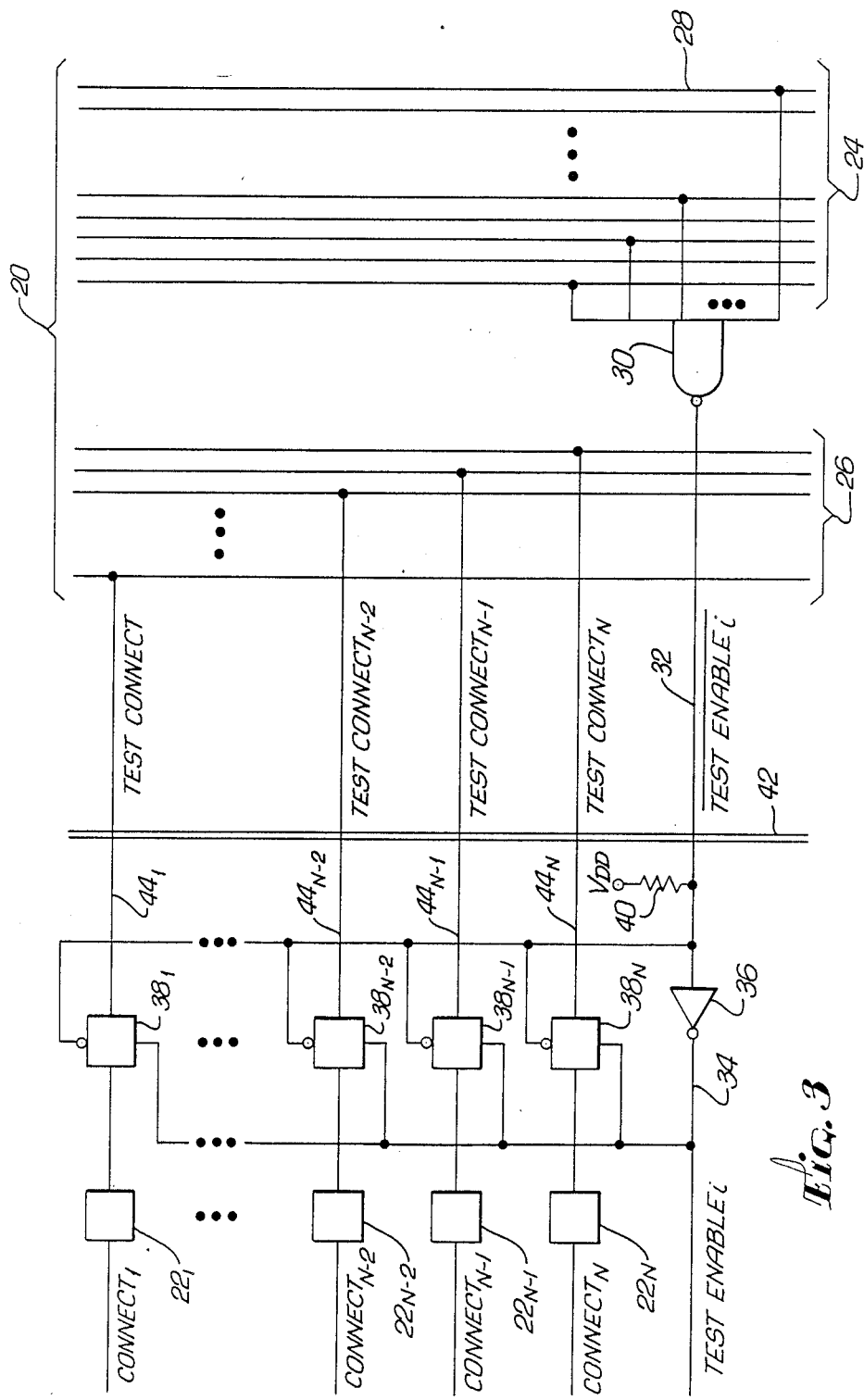
FIG. 3 is a detailed view of a portion of the wafer scale testing, system of FIG. 2 illustrating the connection of the integrated circuit die bonding pads and the interchip multiplexor lines.

Referring to FIG. 2, the semiconductor wafer substrate 10 has a plurality of wafer test pads 14 preferably formed adjacent one edge of the upper surface of wafer 10. Wafer test pads 14 receive externally supplied test signals which are provided to the integrated circuit dies 12 and further receive test output signals from the integrated circuit dies 12 which signals are in turn provided to the external test equipment (not shown). The test signals applied to wafer test pads 14 are routed to the individual integrated circuit dies 12 via an interchip multiplexor system. In a preferred embodiment, the interchip multiplexor system includes an input/output buffer circuit 16, connecting leads 16, and interchip multiplexor lines 20. Input/output buffer circuit 16 decodes the test signals selectively applied to pads 14 into test signals routed to the individual integrated circuit dies 12. The external test signals are provided to input/output buffer circuit 16 from pads 14 through leads 18. The input/output buffer circuit 16 may comprise a demultiplexor circuit which converts the signals applied to pads 14 to a binary encoded chip select signal. The binary encoded chip select signal and the test signals from buffer circuit 16 are routed to the individual integrated circuit dies 12 via interchip multiplexor lines 20. These interchip multiplexor lines 20 are in turn electrically coupled to the individual integrated circuit die bonding pads (as illustrated in FIG. 3). Also, as shown in more detail in FIG. 3, the interchip multiplexor lines 20 will run generally parallel to the dicing lanes which divide the redundant integrated circuit dies 12 into separate regions of the wafer 10.

Referring to FIG. 3, an enlarged view of a portion of FIG. 2 illustrating the interchip multiplexor lines 20 and the connection of individual integrated circuit dies 12 is shown. Each integrated circuit die has a number of electrical bonding pads $22_1$ - $22_N$ substantially as in conventional redundant integrated circuit die systems. As shown in FIG. 3, the interchip multiplexor lines 20 preferably include a chip select address bus 24 and a test connect bus 26. The chip select address bus 24 carries binary encoded chip select signals along lines 28 from input/output buffer circuit 16 (shown in FIG. 2). These binary chip select signals are decoded by multi-input NAND gate 30 to provide a signal $\overline{\text{TEST ENABLE}}_i$ along line 32 and a signal $\overline{\text{TEST ENABLE}}_i$ along line 34 via inverter 36. The signals TEST ENABLE$_i$ and $\overline{\text{TEST ENABLE}}_i$ serve to enable/disable testing of the ith integrated circuit die. These signals TEST ENABLE$_i$ and $\overline{\text{TEST ENABLE}}_i$ are provided to bilateral switches $38_1$ - $38_N$ which connect the die pads 22 of the ith die to the test connect bus 26. As shown in FIG. 3, line 32 is normally held at $V_{DD}$ through connection to $V_{DD}$ through resistor 40, thus keeping $\overline{\text{TEST ENABLE}}_i$ normally high. This will keep the switches 38 off and test connect bus 26 disconnected from the die bonding pads 22 until the ith chip is selected for testing and line 32 is pulled low.

As also shown in FIG. 3, test connect bus 26 will be separated from the die bonding pads 20 by dicing lane 42. Dicing lane 42 defines the general path for sawing the wafer into the individual integrated circuit dies after completion of the fabrication and testing of the dies. As shown in FIG. 3, the bonding pads $22_1$ - $22_N$ are electrically coupled to the lines of test connect bus 26 across saw lane 42 by leads $44_1$ - $44_N$ In order to reduce the tendency of the dicing operation to short the bonding pads $22_1$ - $22_N$ to the substrate, leads $44_1$ - $44_N$ are preferably chosen to be relatively small cross-section metallization lines. The added impedance of the leads $44_1$ - $44_N$ due to their small cross-section will typically have a relatively insignificant effect on the testing function due to their short length. Although the spacing of saw lane 42 from the heavy metallization regions of bonding pads 22 and test connect bus 26 will, in conjunction with the narrow cross-section of leads 44, minimize the tendency of shorting during the dicing operation, nonetheless some shorting may occur. To prevent such shorting interfering with the integrated circuit die operation after dicing, after dicing connection of switches $38_1$ - $38_N$ to $V_{DD}$ via resistor 40 will open the circuit and maintain the pads $22_1$ - $22_N$ disconnected from the leads 44. Thus, after dicing the sole electrical contact with the integrated circuit die 12 is through bonding pads $22_1$ - $22_N$. Additionally, switches $38_1$ - $38_N$ allow the interchip multiplexor lines 20 to function during testing of the wafer 10 even if a fabrication error occurs which would otherwise short out the interchip multiplexor system.

Figure 4:
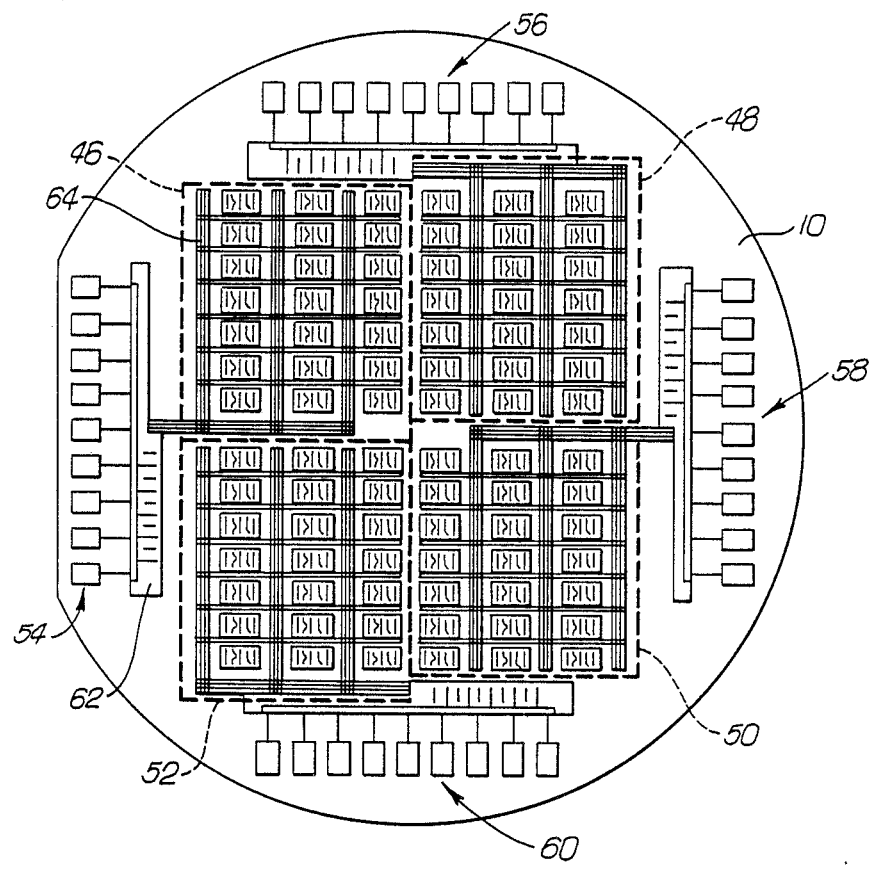
FIG. 4 is a top view of a redundant integrated circuit die wafer employing one embodiment of the wafer scale testing system of the present invention utilizing partitioned wafer scale testing.

Referring to FIG. 4, an alternate embodiment of the wafer scale testing system of the present invention is illustrated wherein the integrated circuit dies on the wafer are partitioned into separate wafer test regions. In the embodiment illustrated in FIG. 4, the integrated circuit dies on wafer 10 are partitioned into four separate testing regions 46, 48, 50 and 52, respectively. The separate testing regions 46, 48, 50 and 52 are connected to four separate sets of wafer scale test pads 54, 56, 58 and 60, respectively. These separate test pads 54, 56, 58 and 60 are in turn coupled to the individual integrated circuit dies within the respective testing regions by separate interchip multiplexor lines and buffer circuits. For example, test pads 54 are connected to the individual integrated circuit dies in region 46 through input/output buffer circuit 62 and interchip multiplexor lines 64. Test pads 56, 58 and 60 are similarly connected to the individual integrated circuit dies in regions 48, 50 and 52.

The partitioning of the integrated circuit dies and wafer scale test system as illustrated in FIG. 4 serves to prevent a flaw in the interchip multiplexor system destroying the usefulness of all the integrated circuit dies on the wafer. For the example illustrated in FIG. 4, in a four-way partitioning of the wafer 10, a flaw in the multiplexor test system will still allow 75% of the integrated circuit dies on the chip to be tested and diced for subsequent packaging.

Although as is apparent from FIGS. 2 and 4, the wafer scale test system of the present invention requires the use of some of the surface area of the wafer 10 which otherwise could be employed for integrated circuit dies, this loss in the silicon area is more than offset by the cost savings in testing. Indeed, although the relative cost significance of testing will vary from application to application, in many applications the testing costs far exceed the silicon costs. In particular, in applications involving non-ambient testing, such as cryogenic testing of IRFPA readout circuits, the cost associated with wire bonding and testing each individual integrated circuit die separately far outweighs the lost silicon area required for the wafer scale testing system of the present invention. Additionally, physical damage to the individual integrated circuit die bonding pads is eliminated and therefore loss of yield due to damage during testing is reduced or eliminated. Accordingly, the present invention provides a less expensive and more efficient system and method for testing redundant integrated circuit dies in a wide variety of applications.

While the foregoing description of the preferred embodiment has been described in terms of specific circuit layouts, materials and interconnections, it will be appreciated by those or ordinary skill in the art that many variations are possible while remaining within the scope of the present invention. In particular, the specific type of integrated circuit die formed on the wafer and subsequently diced into separate dies is not limited to IRFPA readout chips and the present invention is equally suitable for use with a wide variety of analog or digital integrated circuit devices. Additionally, the layout of the test pads on the wafer and the interchip multiplexor design including the layout of the input/output buffer circuits and interchip multiplexor lines may be varied while remaining within the scope of the invention. For example, the wafer scale test pads may be evenly distributed around the wafer or grouped together or otherwise configured on the wafer as desired for the specific testing application and wafer layout. Numerous modifications of the wafer layout and circuit design are also possible.

What is claimed:

1. A redundant die wafer test system, comprising:
   a semiconductor substrate having an upper major surface;
   a plurality of integrated circuit dies formed on said substrate in separate regions of said upper major surface, said separate regions being separated by a plurality of dicing lanes, each of said integrated circuit dies having a plurality of electrical bonding pads;
   a plurality of wafer test pads formed on said substrate;
   interchip multiplexor means, coupled to said plurality of electrical bonding pads and said plurality of wafer test pads, for providing electrical test signals from said wafer test pads to said plurality of integrated circuit dies and providing output test signals from said dies to said wafer test pads said interchip multiplexor means including a plurality of interchip multiplexor lines formed on said upper major surface of said semiconductor substrate and a plurality of electrical leads coupling said electrical bonding pads to said interchip multiplexor lines, said electrical leads traversing said dicing lanes on said upper major surface of said semiconductor substrate; and
   circuit protection means for disconnecting said electrical bonding pads from said multiplexor lines after dicing along said dicing lanes.

2. A redundant die wafer test system as set out in claim 1 wherein said interchip multiplexor means comprises:

a plurality of interchip multiplexor lines formed on said upper major surface of said semiconductor substrate; and input/output multiplexor means coupled to said wafer test pads and said interchip multiplexor lines for receiving test signals applied to said wafer test pads and applying said test signals to selected interchip multiplexor lines and for receiving readout signals from said interchip multiplexor lines and applying said readout signals to selected ones of said wafer test pads.

3. A redundant die wafer test system as set out in claim 1 whereinsaid integrated circuit dies are infrared focal plane array signal processing and readout integrated circuits.

4. A redundant die wafer test system, comprising:

a semiconductor substrate having an upper major surface;

a plurality of integrated circuit dies formed on said substrate in separate regions of said upper major surface, said separate regions being separated by a plurality of dicing lanes, each of said integrated circuit dies having a plurality of electrical bonding pads;

a plurality of wafer test pads formed on said substrate; and interchip multiplexor means, coupled to said plurality of electrical bonding pads and said plurality of wafer test pads, for providing electrical test signals from said wafer test pads to said plurality of integrated circuit dies and providing output test signals rom said dies to said wafer test pads;

wherein said integrated circuit dies are partitioned on said semiconductor substrate in a plurality of groups and wherein said wafer test pads and said interchip multiplexor means are separately provided for each group of integrated circuit dies.

5. A wafer scale test system as set out in claim 4 wherein said input/output buffer circuit comprises a demultiplexor circuit.

6. A wafer scale test system as set out in claim 4 wherein said integrated circuit dies and said input/output buffer circuits are complimentary metal oxide semiconductor circuits.

7. A wafer scale test system as set out in claim 4 wherein said integrated circuit dies are analog infrared focal plane array readout integrated circuit dies.

8. A wafer scale test system as set out in claim 4 wherein said wafer scale test pads, said integrated circuit dies and said interchip multiplexor lines are partitioned into separate groups.

* * * * *